United States Patent [19]
DeRenne

[11] Patent Number: 5,565,784
[45] Date of Patent: Oct. 15, 1996

[54] COAXIAL CABLE TESTING AND TRACING DEVICE

[76] Inventor: Lawrence L. DeRenne, 17 John St. Ct., Reading, Mass. 01867

[21] Appl. No.: 406,466

[22] Filed: Mar. 20, 1995

[51] Int. Cl.$^6$ .................................................. G08B 23/00
[52] U.S. Cl. ......................... 324/527; 324/542; 324/543; 324/556; 324/66; 324/133
[58] Field of Search ............................. 324/133, 66, 506, 324/539, 542, 543, 556

[56] References Cited

U.S. PATENT DOCUMENTS

| | | | |
|---|---|---|---|
| 4,654,580 | 3/1987 | Keller | 324/525 |
| 4,839,599 | 6/1989 | Fischer | 324/539 |
| 4,864,225 | 9/1989 | Long et al. | 324/506 |
| 5,260,664 | 11/1993 | Graham | 324/522 |

*Primary Examiner*—Michael Tokar

[57] ABSTRACT

A coaxial cable testing and tracing device including a plurality of cable terminator plugs each having a characteristic impedance; an electrical testing circuit further including a coaxial cable connector coupleable to an end of a coaxial cable, a signal generating mechanism coupled to the cable connector for generating and transmitting a plurality of characteristic signals with one of the signals indicating an open circuit condition at the cable connector and with the other remaining signals indicating that a coaxial cable coupled to the cable connector has been terminated with a cable terminator plug, and a display mechanism coupled to the signal generator mechanism for receiving a signal therefrom and based on this received signal providing a visual indication of when a coaxial cable coupled to the cable connector has been terminated with a terminator plug and further providing an indication of an open circuit condition at the cable connector; a power supply mechanism for supplying electrical energy; and a power switch mechanism coupled between the power supply mechanism and testing circuit.

3 Claims, 5 Drawing Sheets

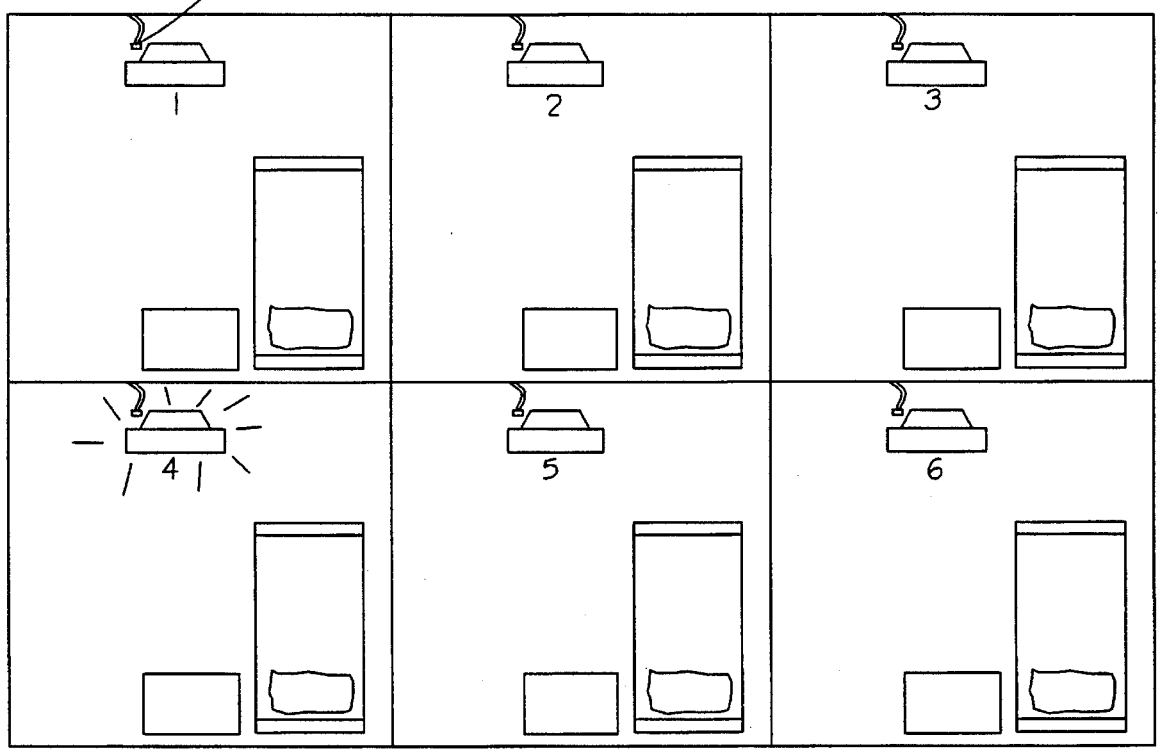
FIG. 6
FIG. 7
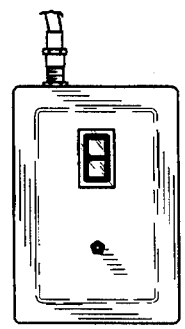
FIG. 8
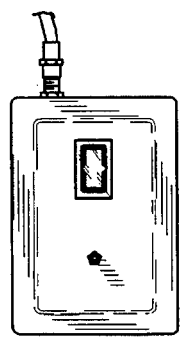

COAXIAL CABLE TESTING AND TRACING DEVICE

BACKGROUND OF THE INVENTION

1. Field of the Invention

The present invention relates to a coaxial cable testing and tracing device and more particularly pertains to testing the continuity of coaxial cables and tracing their termination location with a coaxial cable testing and tracing device.

2. Description of the Prior Art

The use of cable testing apparatuses is known in the prior art. More specifically, cable testing apparatuses heretofore devised and utilized for the purpose of testing and tracing cables are known to consist basically of familiar, expected and obvious structural configurations, notwithstanding the myriad of designs encompassed by the crowded prior art which have been developed for the fulfillment of countless objectives and requirements.

By way of example, U.S. Pat. Des. 315,523 to Marchetti discloses a coaxial cable tester. U.S. Pat. No. 4,413,229 to Grant discloses a method and apparatus of remote indication of faults in coaxial cable R-F transmission systems. U.S. Pat. No. 4,553,085 to Canzano discloses a coaxial cable tester device. U.S. Pat. No. 4,864,225 to Long et al. discloses a coaxial cable tracer and tester. U.S. Pat. No. 4,931,791 to Mallard, Jr. discloses a shorted-coaxial-cable for local-area networks.

While these devices fulfill their respective, particular objective and requirements, the aforementioned patents do not describe a coaxial cable testing and tracing device that allows the continuity of a plurality of coaxial cables to be tested and to individually locate a coaxial cable.

In this respect, the coaxial cable testing and tracing device according to the present invention substantially departs from the conventional concepts and designs of the prior art, and in doing so provides an apparatus primarily developed for the purpose of testing the continuity of coaxial cables and tracing their termination location.

Therefore, it can be appreciated that there exists a continuing need for new and improved coaxial cable testing and tracing device which can be used for testing the continuity of coaxial cables and tracing their termination location. In this regard, the present invention substantially fulfills this need.

SUMMARY OF THE INVENTION

In the view of the foregoing disadvantages inherent in the known types of cable testing apparatuses now present in the prior art, the present invention provides an improved coaxial cable testing and tracing device. As such, the general purpose of the present invention, which will be described subsequently in greater detail, is to provide a new and improved coaxial cable testing and tracing device and method which has all the advantages of the prior art and none of the disadvantages.

To attain this, the present invention essentially comprises, in combination, seven threaded coaxial cable terminator plugs bearing reference integer numerals thereon from 0 to 7, respectively. The terminator plugs further have characteristic impedances of 0 ohms, 22 kilo ohms, 33 kilo ohms, 68 kilo ohms, 180 kilo ohms, and 300 kilo ohms, respectively. Each terminator plug is threadedly securable to an end of a coaxial cable that is coupleable to an associated electronic device. A rigid plastic container is provided and includes an upper portion removably coupled to a lower portion to thereby define a hollow interior therebetween. The upper portion of the container has a rectangular top wall with a peripheral and outwardly angled edge therearound. The lower portion of the container has a rectangular bottom wall with a peripheral outwardly angled edge therearound and a door removably coupled thereto.

An electric testing circuit is disposed within the container for testing purposes. The testing circuit includes a threaded coaxial cable connector extended from the container and coupleable to an end of a coaxial cable at an end thereof remote from an associated cable terminator plug. The testing circuit includes a signal generating mechanism coupled to the cable connector for generating and transmitting one of eight characteristic signal sets with one of the signal sets indicating an open circuit condition at the cable connector and with one of the remaining signal sets indicating that a coaxial cable coupled to the cable connector has been terminated with a cable terminator plug. The testing circuit includes a timer mechanism for generating a sequence of timer activation signals at a characteristic frequency. The testing circuit includes a signal set encoding mechanism coupled to the signal generator mechanism and timer mechanism for transmitting one of eight encoded signal sets based upon receipt of a given signal set. The testing circuit includes a display driver mechanism coupled to the signal set coding mechanism for generating one of eight characteristic driver signal sets based upon receipt of an encoded signal set. One of the driver signal sets is transmitted intermittently at the characteristic frequency of the timer activation signals being received for indicating an open circuit condition present at the cable connector. The testing circuit includes a display mechanism coupled to the display driver mechanism and extended outwards through the top wall of the container for displaying a single integer number of "0", "1", "2", "3", "4", "5", "6" and "8" based upon receipt of a set of display driver signals and with the display of an integer number from "0" to "6" indicating that a coaxial cable that has been coupled to the cable connector has been terminated with the numeric corresponding terminator plug and with the intermittent flashing of the integer number "8" indicating an open circuit condition at the cable connector. The testing circuit includes a battery disposed within the container for supplying electrical energy and with the battery removably accessible through the door of the container. Lastly, the testing circuit includes a power switch mechanism coupled between the battery and testing circuit. The switch mechanism has one orientation for allowing electrical energy to be delivered to the testing circuit and another orientation for preventing such delivery.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved coaxial cable testing and tracing device which has all the advantages of the prior art cable testing apparatuses and none of the disadvantages.

It is another object of the present invention to provide a new and improved coaxial cable testing and tracing device which may be easily and efficiently manufactured and marketed.

It is a further object of the present invention to provide a new and improved coaxial cable testing and tracing device which is of durable and reliable construction.

An even further object of the present invention is to provide a new and improved coaxial cable testing and tracing device which is susceptible of a low cost of manufacture with regard to both materials and labor, and which accordingly is then susceptible of low prices of sale to the consuming public, thereby making such a coaxial cable testing and tracing device economically available to the buying public.

Still yet another object of the present invention is to provide a new and improved coaxial cable testing and tracing device which provides in the apparatuses and methods of the prior art some of the advantages thereof, while simultaneously overcoming some of the disadvantages normally associated therewith.

Even still another object of the present invention is to provide a new and improved coaxial cable testing and tracing device comprising a plurality of cable terminator plugs each having a characteristic impedance; an electrical testing circuit further comprising a coaxial cable connector coupleable to an end of a coaxial cable at an end thereof remote from an associated cable terminator plug, a signal generating mechanism coupled to the cable connector for generating and transmitting a plurality of characteristic signals with one of the signals indicating an open circuit condition at the cable connector and with the other remaining signals indicating that a coaxial cable coupled to the cable connector has been terminated with a cable terminator plug, a display mechanism coupled to the signal generator mechanism for receiving a signal therefrom and based on this received signal providing a visual indication of when a coaxial cable coupled to the cable connector has been terminated with a terminator plug and further providing an indication of an open circuit condition at the cable connector, a power supply mechanism for supplying electrical energy, and a power switch mechanism coupled between the power supply mechanism and testing circuit and having one orientation for allowing electrical energy to be delivered to the testing circuit and another orientation for preventing such delivery.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 6 is a floor plan view of a set of six coaxial television cables each having a cable terminator secured thereto in an orientation for test and with the control box of the present invention at a remote location coupled to one of the coaxial cables of the set and thereby indicating that the cable connected is the one coupled to the cable terminator having an identification number of "4".

FIG. 7 is a side elevational view of the control box of present invention displaying an "8", thereby indicating an open circuit.

FIG. 8 is a side elevational view of the control box of present invention displaying "0", thereby indicating a short circuit.

The same reference numerals refer to the same parts through the various Figures.

DESCRIPTION OF THE PREFERRED EMBODIMENT

Figure 1:
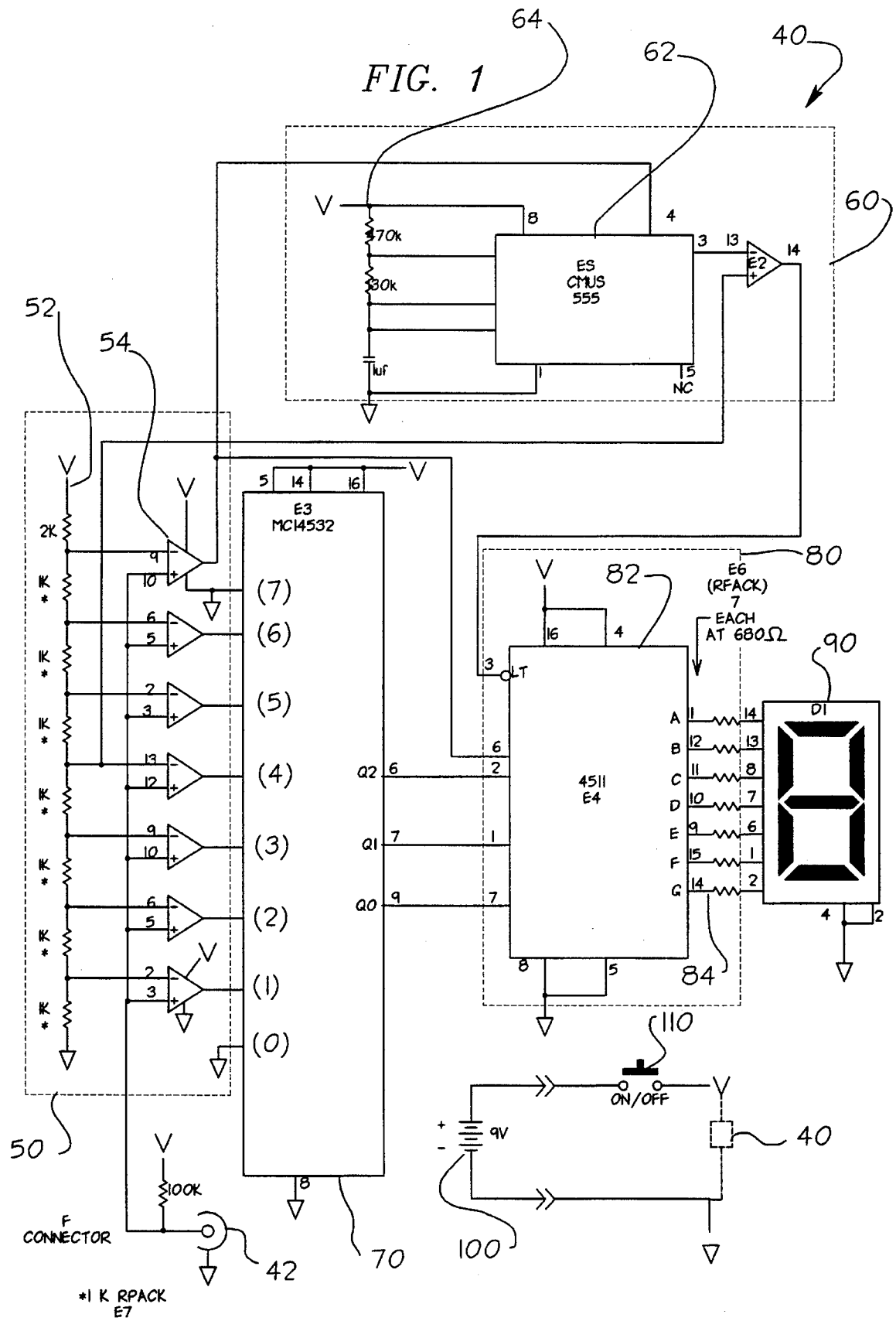
FIG. 1 is a schematic diagram of the preferred embodiment constructed in accordance with the principles of the present invention.
Figure 2:
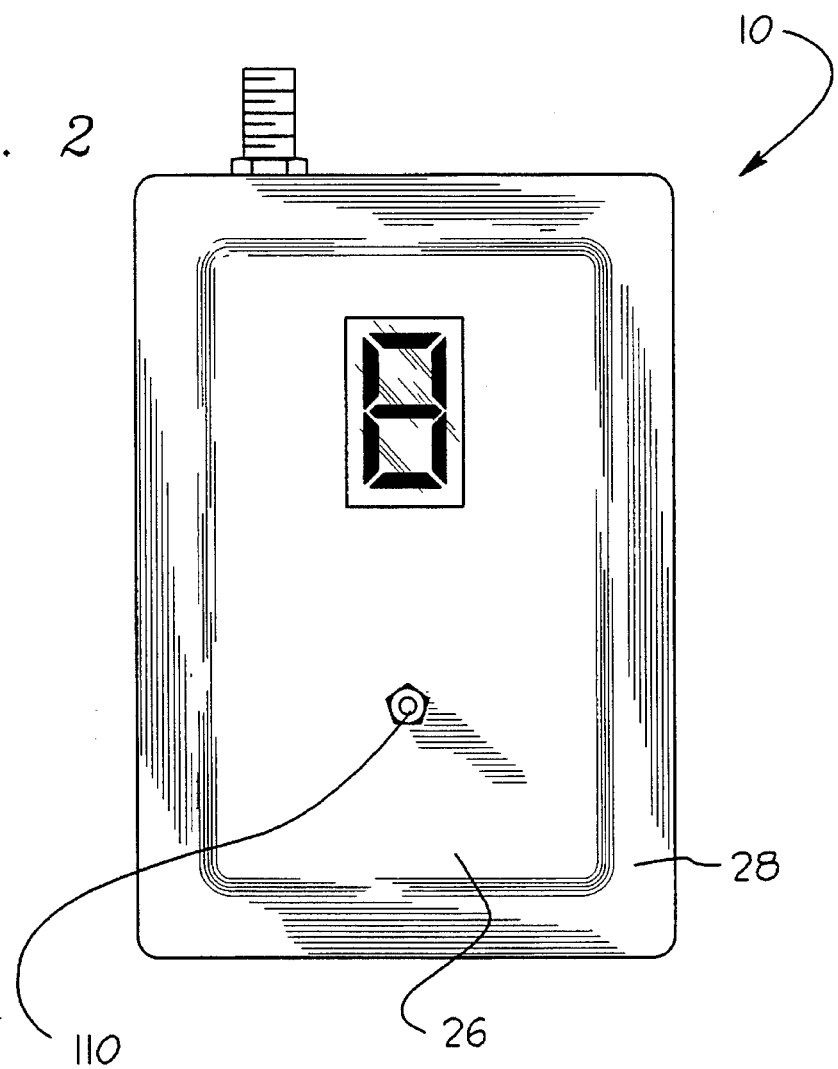
FIG. 2 is a side elevational view of the present invention.
Figure 3:
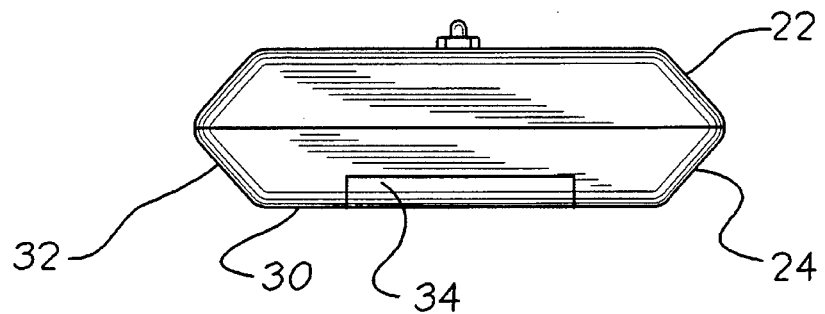
FIG. 3 is a side elevational view of the present invention.

With reference now to the drawings, and in particular, to FIGS. 1 and 2 thereof, the preferred embodiment of the new and improved coaxial cable testing and tracing device embodying the principles and concepts of the present invention and generally designated by the reference number 10 will be described.

The present invention is comprised of a plurality of components. In their broadest context, such components include coaxial terminator plugs, an electrical testing circuit, and a container. Such components are individually configured and correlated with respect to each other to provide the intended function of testing a continuity of a set of coaxial cables and tracing their termination location.

Figure 4:
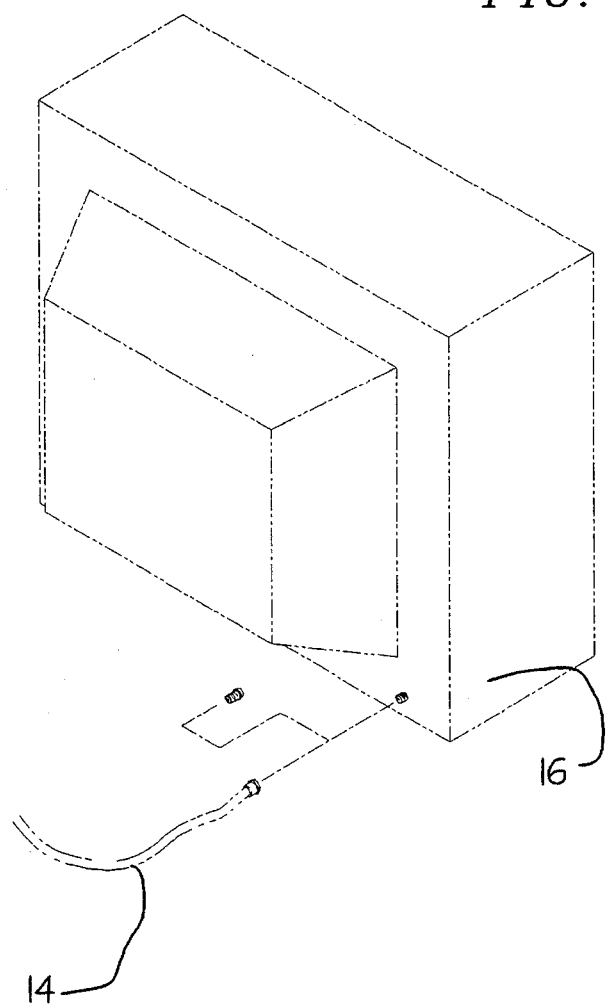
FIG. 4 is a perspective view of a cable terminator being secured to a coaxial cable of a television set for subsequent testing.
Figure 5:
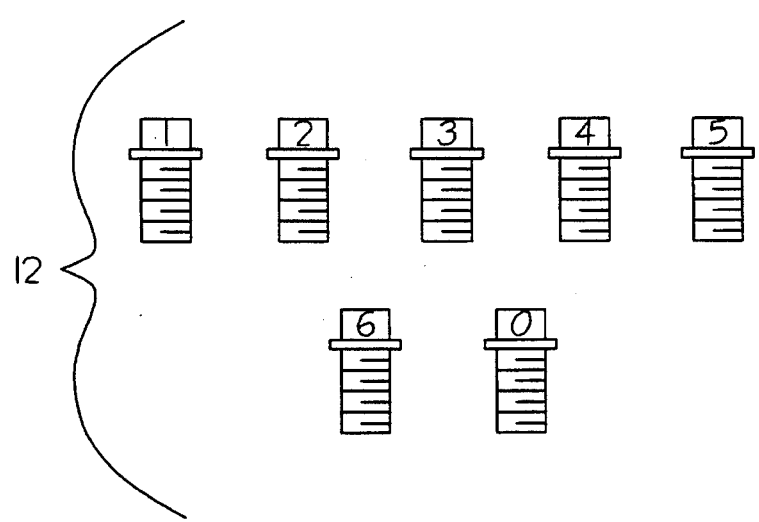
FIG. 5 is a view of the cable terminators of the present invention.

Specifically, the present invention includes seven rigid threaded coaxial cable terminator plugs 12 as shown in FIG. 5. The terminator plugs bear reference numerals thereon from 0 to 6, respectively, for identification purposes. The terminator plugs further have characteristic impedances of 0 ohms, 22 kilo ohms, 33 kilo ohms, 68 kilo ohms, 180 kilo ohms, and 300 kilo ohms, respectively. Each plug is threadedly securable to an end of a coaxial cable 14 that is coupleable to an associated electronic device such as a television 16 as shown in FIG. 4.

The present invention also includes a container 20. The container is formed of a rigid impact-resistant plastic. The container includes an upper portion 22 that is removably coupled to a lower portion 24. When the portions are coupled together, a hollow interior is defined therebetween. The upper portion has a rectangular top wall 26 with an integral and outwardly angled edge 28 therearound. The lower portion has a rectangular bottom wall 30 with an integral and outwardly angled edge therearound. Furthermore, the lower portion has a removable door 34 coupled thereto for allowing access within the container.

An electric testing circuit 40 is disposed within the container to thereby define a control box. The electric circuit includes a threaded coaxial type "F" cable connector 42. The cable connector is extended from the container and coupleable to an end of a coaxial cable 14 as shown in FIG. 6. The cable connector is operably connected to a free end of a coaxial cable. This free end located remote from an associated cable terminator plug 12 connected to the other end of the coaxial cable.

The electric circuit includes a signal generating mechanism 50. The signal generating mechanism is coupled to the cable connector 42. The signal generating mechanism is used for generating and transmitting one of eight characteristic signal sets. One of the signal sets generated indicates that an open circuit condition exists at the cable connector. Each of the remaining signal sets indicates that a coaxial cable 14 coupled to the cable connector has been terminated with one of the aforementioned cable terminator plugs 12. The signal generator mechanism includes an input resistance network 52 including a sequence of 1 kilo ohm resistors. The resistors may be operationally replaced a r-pack to reduce component count and simplify assembly. The output of the resistance 52 network is fed to seven operational amplifiers 54 contained on two commercially available LM 324 quad OP AMP integrated circuits. Each operational amplifiers in conjunction with the resistance network generates signals characteristic of the impedance seen at its input. The operational amplifiers operate in a comparator type mode of operation to generate these characteristic signals.

The electric testing circuit also includes a timing mechanism 60. The timing mechanism is used for generating a sequence of timer activation signals at a characteristic frequency. The timer mechanism is formed of a commercially available 555 timer 62 whose rate of output is adjusted through timer adjustment circuitry 64. The output of the 555 timer is fed to the remaining unused amplifier on one of the LM 324 quad OP amp integrated circuit used in constructing the signal generating mechanism 50.

A signal set encoding mechanism 70 is also included. The signal set encoding mechanism is coupled to the signal generator mechanism 50 and timer mechanism 60 for transmitting one of eight encoded signal sets. One of these encoded signal sets is transmitted based upon receipt of a given signal set from the signal generating mechanism 50. The signal set encoding mechanism is formed of a commercially available MC14532 binary encoding integrated circuit. The MC14532 has its inputs coupled to the amplifier of the timer mechanism and the output of the signal generating mechanism 50.

The output of the signal set encoding mechanism is fed to a display driver mechanism 80. The display driver mechanism is used for generating one of eight characteristic driver signal sets based upon receipt of an encoded signal set. The display driver mechanism includes a commercially available 4511 seven segment display driver integrated circuit 82 whose input is connected to the MC14532 as well as the amplifier of the timer mechanism 60. The output of the seven segment display driver is fed to the resistive network 84 of seven 680 ohm resistors for providing a compatible output signal for use. The resistive network 84 may be operationally replaced with a r-pack to reduce component count and simply assembly. One of the driver signal sets is transmitted intermittently at the characteristic frequency at which the timer activation signals are being received. The remaining driver signal sets are transmitted at a constant value.

The driver signal sets are fed to a display mechanism. The display mechanism is coupled to the driver mechanism 80 and extended outwards through the top wall of the container. A display driver is formed of a commercially available seven segment display integrated circuit 90. The seven segment display 90 displays a single number of "0", "1", "2", "3", "4", "5", "6", or "8" based upon receipt of a particular set of display driver signals. The display of an integer number of "0" through "6" indicates that a coaxial cable that has been coupled to a cable connector has been terminated with a corresponding terminator bearing the same reference number. Furthermore, the intermittent flashing of the integer number "8" indicates an open circuit condition at the cable connector.

A battery 100 is disposed within the container for supplying electrical energy to the electric testing circuit 40. The battery is removably accessible through the door of the container. The battery is conventional in design and commercially available.

Lastly, a power switch mechanism 110 is coupled between the battery 100 and testing circuit 40. The power switch mechanism consists of a normally open single pole single throw push button switch. The push button switch has a depressed orientation for allowing electrical energy to be delivered to the testing circuit for operation. The push button has a released orientation for preventing such delivery. Through use of the push button switch, electrical energy is only provided to the testing circuit as needed, thereby extending the operable life of the battery.

The present invention is a portable test instrument which electronically traces up to seven coaxial cables or seven coaxial video cables routed through walls. The test instrument also tests for short and open circuits that indicate damaged or faulty coaxial wiring. The hand-held test instrument is about 4 inches tall by 3 inches wide by 1.5 inches thick. The present invention employs digital and analog integrated circuits powered by a 9 volt battery contained in a plastic container. Mounted on the outside of the unit is a F-type electrical cable connector, a seven segment single digit display, and a momentary contact push button switch. Seven F-type cable connector terminators plugs, each having a different electrical impedance value, are used in conjunction with the testing circuit.

Each of the seven test terminators plugs has a known resistance value with an assigned identification number thereon from "0" to "6", respectively The present invention identifies both ends of a cable by measuring the resistance of the test terminator and comparing it to the number assignments. To trace and identify a particular cable from a set of cables, place the test terminators on the ends of coaxial cables that are have been decoupled from associated electronic devices. Now, couple a free end of one of the cables remote from the terminators to the cable connector and depress the power switch. The assigned value of the test terminator, ranging from "0" to "6", will be displayed. If the cable is connected to the ground shield terminator plug, "0" will be displayed. If the cable is severed or not connected to a test terminator, an "8" will flash intermittently. The present invention is portable and will not damage electronic equipment or cables. Battery life is extended since the testing circuit is operable only when the power switch is pressed. Although designed primarily for cables with cable television type "F" connectors, adapters may be used for type "F" to other connector families such as "BNC" and "SMA".

Figure 9:
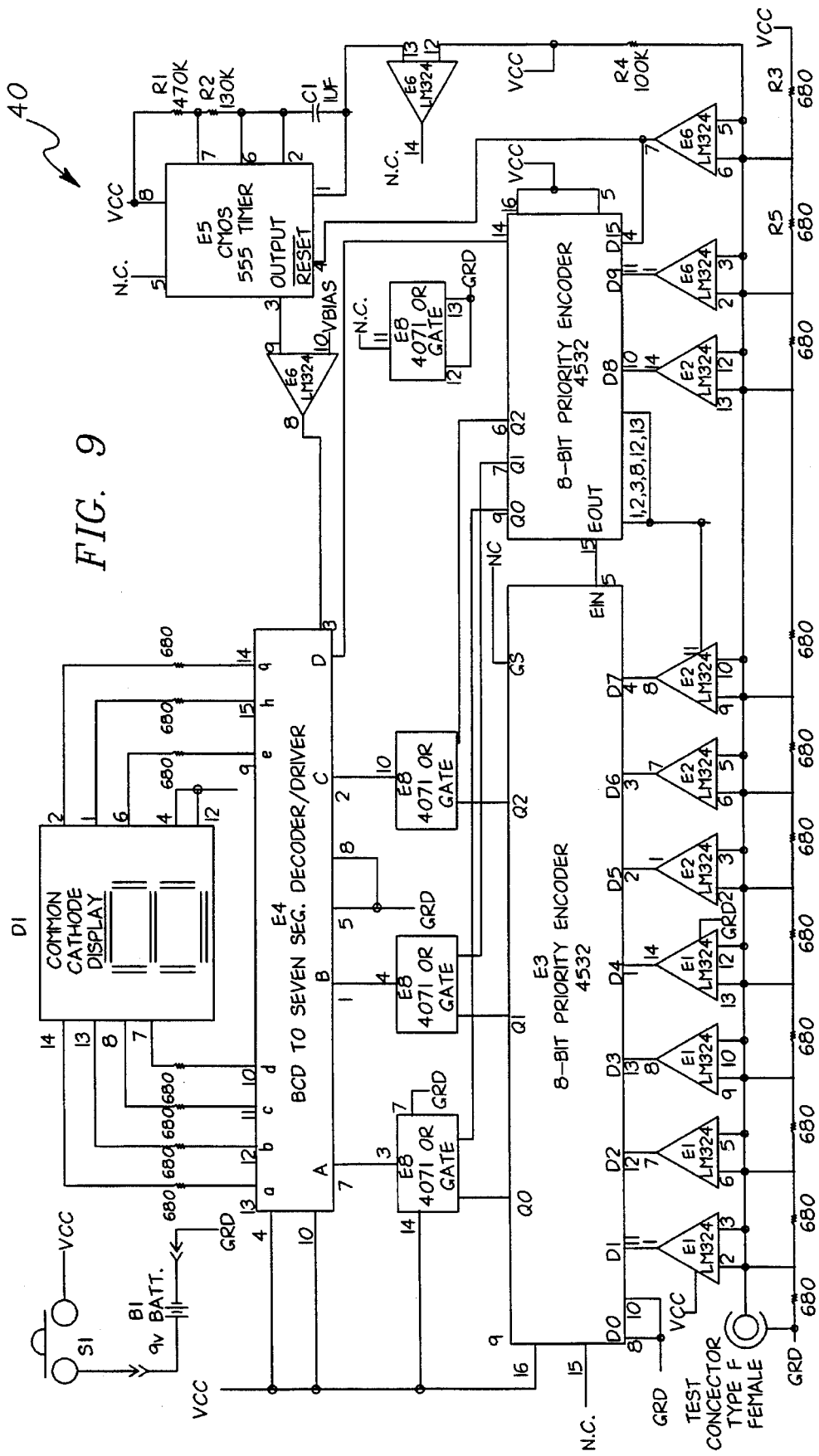
FIG. 9 is a schematic diagram of an alternate embodiment of the present invention capable of tracing ten coaxial cables.

An alternate embodiment of the testing circuit is shown in FIG. 9. This embodiment is capable of tracing ten coaxial cables. The main physical difference between this testing circuit and that previously described is the addition of a LM324 operational amplifier, a 4532 priority encoder, a 4071 OR gate, and the number and values of the resistors within the voltage divider network. Additionally, three additional cable terminator plugs with differing characteristic impedances are also supplied to allow such tracing to be performed. Since the seven segment decoder and display are capable of indicating ten different numbers (0–9), the additional three terminator plugs bear unique reference numerals thereon for identification purposes.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and the manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modification and changes will readily occur to those skilled in the art, it is not desired to limit the invention to the exact construction and operation shown and described, and accordingly, all suitable modification and equivalents may be resorted to, falling within the scope of the invention.

What is claimed as being new and desired to be protected by Letters Patent of the United States is as follows:

1. A coaxial cable testing and tracing device for testing the continuity of coaxial cables and tracing their termination location comprising, in combination:

seven threaded coaxial cable terminator plugs bearing reference integer numerals thereon from 0 to 7, respectively, and further having characteristic impedances of 0 ohms, 22 kilo ohms, 33 kilo ohms, 68 kilo ohms, 180 kilo ohms, and 300 kilo ohms, respectively, each terminator plug threadedly securable to an end of a coaxial cable, the other end of the coaxial cable coupled to an associated electronic device;

a rigid plastic container including an upper portion removably coupled to a lower portion to thereby define a hollow interior therebetween, the upper portion having a rectangular top wall with a peripheral and outwardly angled edge therearound, the lower portion having a rectangular bottom wall with a peripheral outwardly angled edge therearound and a door removably coupled thereto;

an electric testing circuit disposed within the container and further comprising:
a threaded coaxial cable connector extended from the container and coupleable to an end of a coaxial cable at an end thereof remote from an associated cable terminator plug;
signal generating means coupled to the cable connector and operatively associated with the terminator plugs for generating and transmitting one of eight characteristic signal sets with one of the signal sets indicating an open circuit condition at the cable connector and with one of the remaining signal sets indicating that a coaxial cable coupled to the cable connector has been terminated with a cable terminator plug;
timer means for generating a sequence of timer activation signals at a characteristic frequency;
signal set encoding means coupled to the signal generator means and timer means for transmitting one of eight encoded signal sets based upon receipt of a given signal set and with one of the encoded signal sets being transmitted intermittently at the characteristic frequency of the timer activation signals being received;
display driver means coupled to the signal set coding means for generating one of eight characteristic driver signal sets based upon receipt of an encoded signal set;
display means coupled to the display driver means and extended outwards through the top wall of the container for displaying a single integer number of "0", "1", "2", "3", "4", "5", "6" and "8" based upon receipt of a set of display driver signals and with the display of an integer number from "0" to "6" indicating that a coaxial cable that has been coupled to the cable connector has been terminated with the corresponding numeric terminator plug and with the intermittent flashing of the integer number "8" indicating an open circuit condition at the cable connector;
a battery disposed within the container for supplying electrical energy and with the battery removably accessible through the door of the container; and
power switch means coupled between the battery and testing circuit, the switch means having one orientation for allowing electrical energy to be delivered to the testing circuit and another orientation for preventing such delivery.

2. A coaxial cable testing and tracing device comprising:

a plurality of cable terminator plugs each having a characteristic impedance and with each plug securable to an end of a coaxial cable, wherein the cable terminator plugs include seven threaded coaxial cable terminator plugs bearing different reference numerals thereon for identification purposes and each further having a different characteristic impedance;

an electrical testing circuit further comprising:
a coaxial cable connector coupleable to an end of a coaxial cable at an end thereof remote from an associated cable terminator plug;
signal generating means coupled to the cable connector and operatively associated with the terminator plugs for generating and transmitting a plurality of characteristic signals with one of the signals indicating an open circuit condition at the cable connector and with the other remaining signals indicating that a coaxial cable coupled to the cable connector has been terminated with a cable terminator plug;

display means coupled to the signal generator means for receiving a signal therefrom and based on this received signal providing a visual indication of when a coaxial cable coupled to the cable connector has been terminated with a terminator plug and further providing an indication of an open circuit condition at the cable connector, wherein the display means displays a value for identifying a terminator plug with a given characteristic impedance and further displays a flashing value for identifying an open circuit condition;

power supply means for supplying electrical energy; and power switch means coupled between the power supply means and testing circuit and having one orientation for allowing electrical energy to be delivered to the testing circuit and another orientation for preventing such delivery.

3. The coaxial cable testing and tracing device as set forth in claim 2 wherein the electric circuit is generally encased in a rigid plastic container with the display means and switch means extended outwards therefrom for use.

* * * * *